(12) United States Patent
Hirama

(10) Patent No.: US 7,295,142 B2
(45) Date of Patent: Nov. 13, 2007

(54) DIGITAL-TO-ANALOG CONVERTER WITH SHORT INTEGRATION TIME CONSTANT

(75) Inventor: Atsushi Hirama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/475,992

(22) Filed: Jun. 28, 2006

(65) Prior Publication Data

US 2007/0008203 A1    Jan. 11, 2007

(30) Foreign Application Priority Data

Jul. 7, 2005 (JP) .............................. 2005-198610

(51) Int. Cl.
*H03M 1/66* (2006.01)
*G06F 3/038* (2006.01)

(52) U.S. Cl. ...................... 341/145; 341/144; 341/154; 345/98; 345/204

(58) Field of Classification Search ................ 341/144, 341/145, 154
See application file for complete search history.

(56) References Cited

U.S. PATENT DOCUMENTS

| | | | |
|---|---|---|---|
| 6,326,913 B1 * | 12/2001 | Chao et al. ................... | 341/144 |
| 6,445,325 B1 * | 9/2002 | Burns ........................... | 341/144 |
| 6,556,162 B2 | 4/2003 | Brownlow et al. | |
| 6,570,560 B2 * | 5/2003 | Hashimoto ................... | 345/211 |
| 6,600,439 B1 * | 7/2003 | Pahr ............................. | 341/158 |
| 6,781,532 B2 * | 8/2004 | Wei .............................. | 341/122 |
| 6,888,526 B2 * | 5/2005 | Morita ......................... | 345/95 |
| 7,129,877 B2 * | 10/2006 | Wang et al. .................. | 341/150 |
| 7,161,517 B1 * | 1/2007 | Yen et al. ..................... | 341/145 |
| 2003/0151577 A1 * | 8/2003 | Morita ......................... | 345/89 |
| 2004/0104878 A1 * | 6/2004 | Tsutsui et al. ................ | 345/89 |
| 2006/0181544 A1 * | 8/2006 | Morita ......................... | 345/600 |
| 2006/0214900 A1 * | 9/2006 | Tsuchi et al. ................. | 345/98 |

\* cited by examiner

*Primary Examiner*—Linh Nguyen
(74) *Attorney, Agent, or Firm*—Nixon Peabody LLP; Donald R. Studebaker

(57) ABSTRACT

In the two-stage conversion type of digital-to-analog converter, the m most significant bits in a digital signal are provided to a first-stage selector, selecting a pair of adjacent lower and upper limit voltages among $2^m+1$ different stepwise voltages generated by a resistive voltage divider. The resistors divide the voltage between the lower and upper limits into different divided voltages. A second-stage selector selects corresponding one of the divided voltages according to two least significant bits in the digital signal. When the digital signal changes, a load signal is provided for a predetermined time period, allowing switches to short-circuit respective component resistors. The output of the second-stage selector is thus quickly charged to the upper limit voltage when the digital signal changes. When the load signal subsequently stops, the normal divided voltage is generated, providing the target output voltage. Thus, the conversion accuracy and response speed are improved.

13 Claims, 3 Drawing Sheets

DIGITAL-TO-ANALOG CONVERTER WITH SHORT INTEGRATION TIME CONSTANT

BACKGROUND OF THE INVENTION

1. Field of the Invention

The present invention relates to a digital-to-analog (D/A) converter, which is applicable to a liquid crystal display drive circuit or the like that generates a voltage in response to a digital signal to drive a liquid crystal display device.

2. Description of the Background Art

Reference is first made to FIG. 2, which is a schematic block diagram showing a conventional digital-to-analog converter disclosed by U.S. Pat. No. 6,556,162 to Brownlow et al. The digital-to-analog converter is a two-stage conversion system that comprises a first-stage converter section 1 and a second-stage converter section 2. The first-stage converter section 1 selects, according to the m most significant bits (MSBs) in the digital signal DI of k (=m+n) bits, a pair of adjacent voltages from the voltages of 0 to $2^m$. The first-stage converter section 1 then outputs the selected voltages as an upper voltage limit VH and a lower voltage limit VL. The second-stage converter section 2 divides the voltage between the upper voltage limit VH and the lower voltage limit VL into $2^n$ segment voltages which are equal to each other. The second-stage converter section 2 then selects one of the segment voltages according to the n least significant bits (LSBs) in the digital signal DI.

The second-stage converter section 2 comprises: a resistive voltage divider 3 which divides the voltage between the upper limit voltage VH and the lower limit voltage VL into the $2^n$ equal segment voltages; a switch group 4 which selects one of the $2^n$ segment voltages to output the selected one; and a decoder (DEC) 2a which decodes the n bits to turn on a corresponding switch of the switch group 4.

To the output of the second-stage converter section 2, i.e., to the output of the switch group 4, a capacitive load CL such as a liquid crystal display device is connected via an output buffer including a voltage-follower-connected operational amplifier (OP) 5.

In the digital-to-analog converter, the first-stage converter section 1 selects, in response to the MSB bit in the digital signal DI, a pair of adjacent voltages VH and VL from the voltages of 0 to $2^m$ provided by the low-impedance reference voltage source. The second-stage converter section 2 selects a voltage specified by the LSB bit in the digital signal DI from the $2^n$ equal segment voltages divided from the voltage between the voltage limits VH and VL.

In the above-described digital-to-analog converter, however, the voltages of 0 to $2^m$ that are provided to the first-stage converter section 1a are generated generally by a resistive voltage divider having lower resistance. Between the voltages VH and VL outputted from the first-stage converter section 1 connected in parallel is the resistive voltage divider 3 of the second-stage converter section 2. Smaller resistance of the resistive voltage divider 3 may therefore vary the voltages VH and VL, providing inaccurate analog voltages. The liquid crystal display device or the like will require as many digital-to-analog converters as the number of display electrodes to be connected in parallel with the resistive voltage divider having lower resistance. A plurality of digital-to-analog converters operating at the same time may cause the reference voltage to vary more significantly.

Larger resistance of the resistive voltage divider 3 may increase the time constant of the integrator circuit. The time constant comes from the combination of that resistance with the input capacitance of the operational amplifier 5. A larger time constant may provide a lower response speed, which causes the display device not to follow the fast motion of a displayed image.

SUMMARY OF THE INVENTION

It is an object of the present invention to provide a two-stage conversion type of digital-to-analog converter that has high conversion accuracy and a high response speed.

In accordance with the present invention, a digital-to-analog converter for converting a digital signal including a plurality of bits into a corresponding analog voltage, comprises: a first divider for dividing a voltage between a lower reference voltage and an upper reference voltage into a plurality of stepwise voltages; a first selector for selecting, according to at least one most significant bit in the digital signal, a pair of lower limit voltage and upper limit voltage adjacent to each other among the plurality of stepwise voltages; a second divider having a resistor for dividing the voltage between the lower limit voltage and the upper limit voltage into a plurality of divided voltages; a second selector for selecting, according to at least one least significant bit in the digital signal, a voltage associated with the at least one least significant voltage among the plurality of divided voltages as an output voltage; and a switch provided in parallel with the resistor in the second divider for short-circuiting opposite ends of the resistor for a predetermined period of time.

In accordance with the present invention, when the digital signal changes, a switch short-circuits the resistor in the second divider in response to a load signal that is provided for the predetermined period of time. The second divider thus has low total resistance, which may reduce the time constant of the integration circuit. The time constant comes from the combination of the total resistance and the input capacitance of the second selector, the buffer amplifier or the load connected to the second divider. The output voltage may thus quickly change to follow the digital signal change. When the load signal stops, the switch is opened and the second divider resistance returns to its normal value, allowing the output voltage to quickly change to the normal voltage. The present invention may thus provide a digital-to-analog converter that has high conversion accuracy and a high response speed.

The above-described switches may be replaced with switches that reduce the resistance of the respective resistors of the second divider to a predetermined value. The switches may be controlled in response to a load signal that is provided for a predetermined period of time when the digital signal changes.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
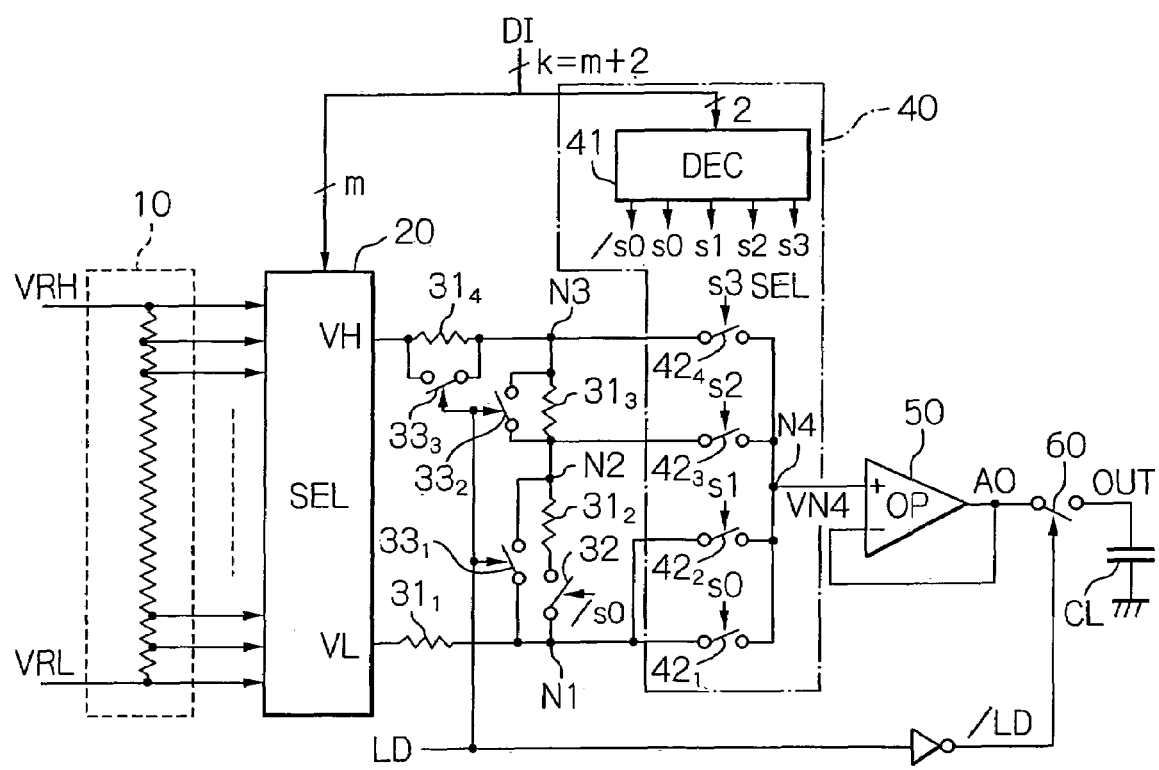
FIG. 1 is a schematic block diagram showing a preferred embodiment of the digital-to-analog converter according to the present invention.
Figure 2:
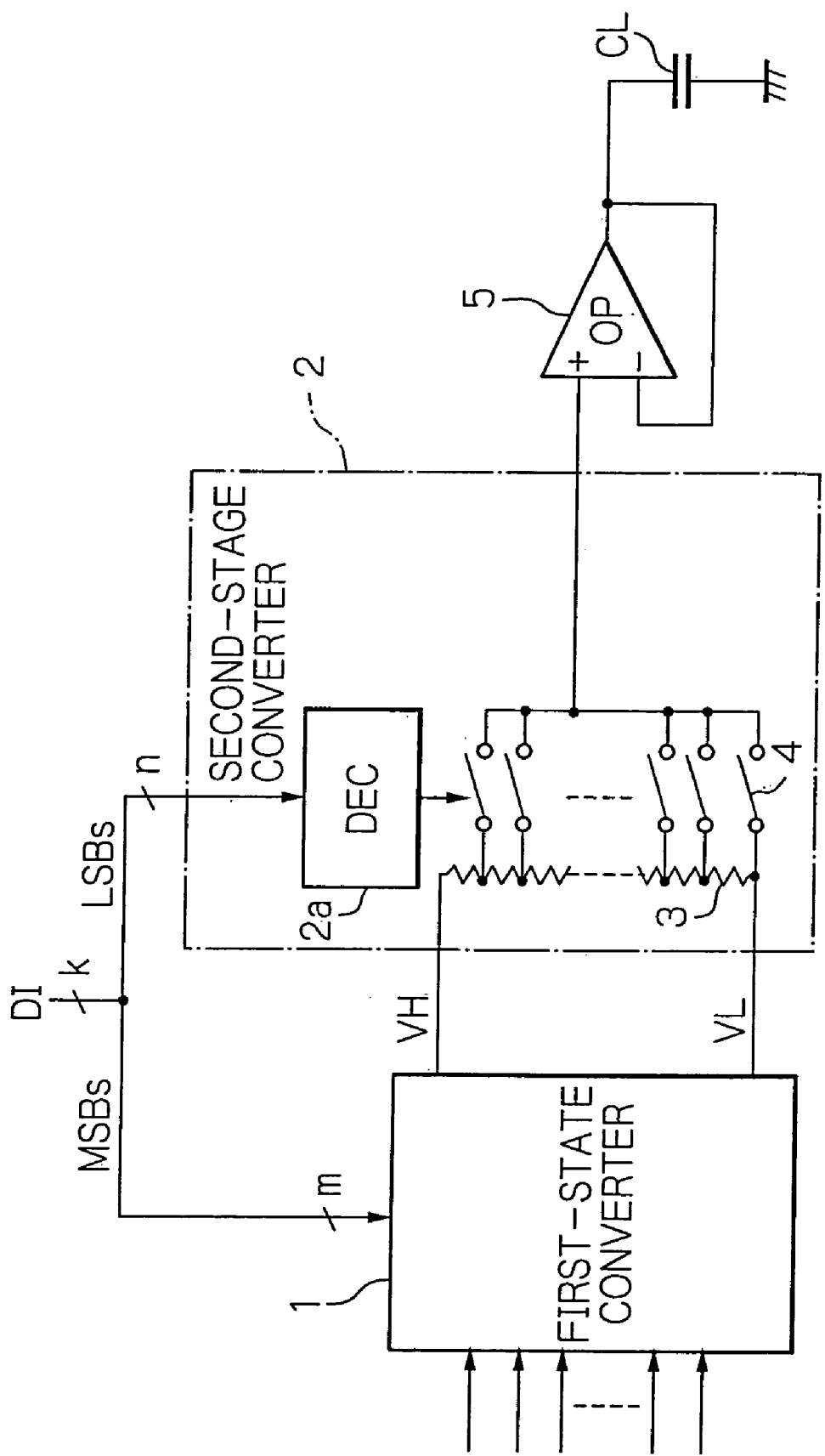
FIG. 2 is a schematic block diagram showing a conventional digital-to-analog converter.

FIG. 1 is a schematic block diagram of the digital-to-analog converter of an embodiment-according to the present invention. The digital-to-analog converter of the embodiment is also the type of two-stage converter similar to what is shown in FIG. 2. The illustrative digital-to-analog (D/A) converter is adapted to generate an output voltage OUT to drive a liquid crystal display device in response to the digital signal DI represented by a plurality (k) of bits, where k is a natural number equal to m+2, m also being a natural number.

The digital-to-analog converter comprises a first-stage resistive voltage divider 10 that is adapted to divide a drive voltage ranging from a lower reference voltage VRL, for example, 8 volts (V), to an upper reference voltage VRH, for example, 16 V, into $2^m+1$ different stepwise voltages. The resistive voltage divider 10 comprises $2^m$ component resistors connected in series, each resistor having its resistance r equal to about 100 [ohm], for example. The resistive voltage divider 10 generates $2^m+1$ different stepwise voltages across its opposite terminals and the connection points or nodes in between. The resistive voltage divider 10 outputs the $2^m+1$ different stepwise voltages to the first-stage selector (SEL) 20. The embodiment is only for illustrative purposes and are not intended to limit the scope of the invention. Signals are designated with reference numerals of connections on which they appear.

The selector 20 functions as selecting in pair adjacent ones of the $2^m+1$ different stepwise voltages according to the m most significant bits (MSBs) in the digital signal DI. The selector 20 then outputs the selected pair of voltages as an upper voltage limit VH and a lower voltage limit VL.

The selector 20 outputs the lower limit voltage VL to one end of a component resistor 31, included in the second-stage resistive voltage divider 40. The component resistor $31_1$ has its other end connected to a node N1. The node N1 connects via a switch 32 to one end of the resistor $31_2$. The resistor $31_2$ has its other end connected to another node N2. The node N2 connects via a resistor $31_3$ to still another node N3. To the node N3 is connected one end of the resistor $31_4$. To the other end of the resistor $31_4$ is provided the upper limit voltage VH outputted from the selector 20. each of these resistors $31_1$ to $31_4$ has its resistance R (for example, 200 k[ohm]) much greater than the resistors included in the resistive voltage divider 10.

Between the nodes N1 and N2, a switch $33_1$ is connected. Between the nodes N2 and N3, a switch $33_2$ is connected. Further, across the resistor $31_4$, a switch $33_3$ is connected. These switches $33_1$ to $33_3$ are in the conductive or ON state thereof when a load signal LD is at "H" level, thus short-circuiting the resistors between the nodes. The load signal LD has its waveform becoming its high "H" level only for a predetermined period of time when the digital signal DI changes or transfers its logical state. To the nodes N1 to N3, the second-stage selector 40 is connected.

The second-stage selector 40 functions as selecting, according to the two least significant bits (LSBs) in the digital signal DI, the divided or segment voltage of one of the nodes corresponding thereto. The selector 40 comprises a decoder (DEC) 41 that decodes the two least significant bits in the digital signal DI, and switches $42_1$ to $42_4$ that are ON and OFF controlled with the signal decoded by the decoder 41.

The decoder 41 is operative in response to the two least significant bits in the digital signal DI to raise one or ones of its output signals s0, s1, s2, and s3 which corresponds or correspond to the values 0, 1, 2, and 3 represented by the two least significant bits to the high "H" level thereof. The remaining signals not corresponding to the values represented by the two least significant bits are tendered to the low "L" level thereof. The-decoder 41 also outputs a signal/s0 to the switch 32 at the same time, the signal/s0 being obtained by inverting the logical level of the signal s0. The switch 32 takes its ON state when the signal/s0 is at its "H" level.

The switch $42_1$ is connected between the node N1 and the node N4 on the output side, and is controlled with the signal s0. The switch $42_2$ is connected between the nodes N1 and N4, and is controlled with the signal s1. Further, the switch $42_3$ is connected between the nodes N2 and N4, and is controlled with the signal s2. Finally, the switch $42_4$ is connected between the nodes N3 and N4, and is controlled with the signal s3. These switches $42_1$ to $42_4$ take the ON state thereof when the signals s0 to s3 become "H" level, respectively.

To the node N4 is connected an output buffer including a voltage-follower-connected operational amplifier 50. The operational amplifier 50 is adapted for producing a signal AO via a switch 60 to a capacitive load CL, such as a liquid crystal display device, in the form of output voltage OUT. The switch 60 is rendered to its ON state when the inverse load signal/LD obtained by inverting the load signal LD is at its "H" level.

Although FIG. 1 shows the first-stage resistive voltage divider 10 having its output interconnected to only one digital-to-analog converter including the selectors 20 and 40, the digital-to-analog converter may be applied in practice to a liquid crystal display drive circuit in such a fashion that the resistive voltage divider 10 has its output interconnected to the same digital-to-analog converters provided in parallel as many as the number of display electrodes of the liquid crystal display device.

Figure 3:
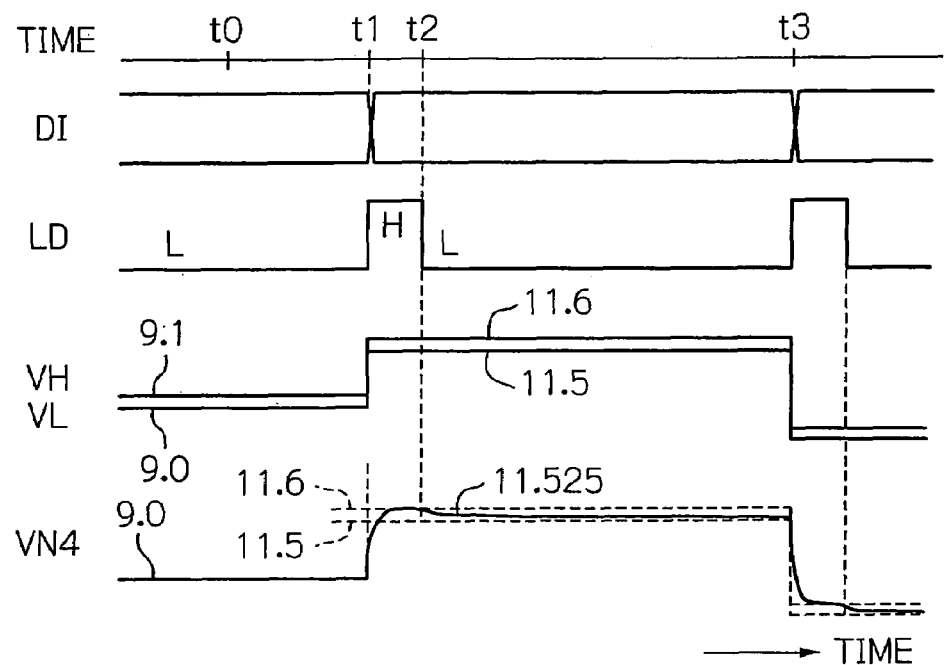
FIG. 3 shows signal waveforms appearing in operation of the digital-to-analog converter shown in FIG. 1.

Now reference will also be made to FIG. 3 showing signal waveforms appearing in operation of the digital-to-analog converter shown in FIG. 1. In operation, for example, at time t0 when the operation is stable, the selector 20 selects, according to the m most significant bits in the digital signal DI, stepwise voltages 9.0 V and 9.1 V as the lower limit voltage VL and the upper limit voltage VH, respectively, and the two least significant bits in the digital signal DI have a value of binary "0". The load signal LD is at its "L" level, all of the switches $33_1$ to $33_3$ are in the OFF state thereof, and the switch 60 is in its ON state.

Because the two least significant bits in the digital signal DI have a value of binary "0", the signals s0 and /s0 outputted from the decoder 41 are of the "H" and "L" levels thereof, respectively. The switch 32 thus becomes its OFF state, thus providing the lower limit voltage VL to the node N4 through the resistor $31_1$, node N1, and switch $42_1$. The node N4 thus has the resultant voltage VN4 equal to 9.0 V. The operational amplifier 50 then outputs the lower limit voltage VL (9.0 V) as the output signal AO. The output signal AO is provided through the switch 60 to the liquid crystal display device CL as the output voltage OUT.

Now, at time t1, the digital signal DI changes its state such that the selector 20 selects, according to the m most significant bits in the digital signal DI, stepwise voltages 11.5 V and 11.6 V as the lower limit voltage VL and upper limit voltage VH, respectively, and such that the two least significant bits have a value of binary "1". When the digital signal DI changes, the load signal LD becomes its "H" level for the predetermined period of time.

Because the two least significant bits in the digital signal DI have a value of binary "1", the signals /s0 and s1 become the "H" level thereof, and the signals s0, s2, and s3 become the "L" level thereof. The switches 32 and $42_2$ thus become the ON state thereof. Because the load signal LD is at its "H" level, the switches $33_1$ to $33_3$ become the ON state thereof. The switches $33_1$ to $33_3$, therefore, short-circuit the resistors $31_2$ to $31_4$, causing the divided or segment voltages on the nodes N1 to N3 to be-the upper limit voltage VH (11.6 V). The voltage of the node N1 is provided via the switch $42_2$ to the node N4. Because the upper limit voltage VH is applied to the node N4 via the switches $33_1$ to $33_3$ in the ON state thereof, the voltage VN4 of the node N4 increases rapidly to 11.6 V of the upper limit voltage VH regardless of the input capacitance of the operational amplifier 50 or the like. The operational amplifier 50 outputs the voltage VN4 as the output signal AO. The output voltage OUT is not, however, outputted because the switch 60 at the output is in its OFF state.

At time t2, the digital signal DI remains its current state, and the load signal LD returns to its "L" level. The switches $33_1$ to $33_3$ thus become the OFF state thereof, allowing the four resistors $31_1$ to $31_4$ connected in series to connect the voltages VL and VH. The node N1 thus changes its voltage from 11.6 V to 11.525 V of the normal voltage. The voltage VN4 of the node N4 also changes its voltage from 11.6 V to 11.525 V. Because the input capacitance of the operational amplifier 50 or the like has already been charged to 11.6 V, the voltage VN4 of the node N4 may quickly change to 11.525 V. The operational amplifier 50 outputs the voltage VN4 as the signal AO. The signal AO is then provided via the output-side switch 60 in its ON state to the liquid crystal display CL as the output voltage OUT. Subsequently, the same operation will repeat every time the digital signal DI changes periodically.

As described above, the digital-to-analog converter in this illustrative embodiment includes the switches $33_1$ to $33_3$ that short-circuit, when the digital signal DI changes its logical state, the resistors $31_2$ to $31_4$ in the second-stage resistive voltage dividers in order to rapidly increase the voltages of the nodes N1 to N3 to the upper limit voltage VH, and in order to charge the node N4 on the input of the operational amplifier 50 to the upper limit voltage VH. This may have an advantage that even when the digital signal DI largely changes its state, the digital-to-analog converter may output, correspondingly to the signal DI, the output signal AO having higher conversion accuracy and a higher response speed.

As described above, the switch 32 resides in series with the second-stage resistive voltage dividers $31_1$ to $31_4$. When the two least significant bits in the digital signal DI have a value of binary "0", the switch 32 isolates the resistive voltage dividers from the output of the selector 20, providing the lower limit voltage VL to the node N4. The second-stage resistive voltage dividers are thus not connected in parallel when the two least significant bits have a value of binary "0", thereby further reducing the error.

The present invention is not limited to the above-described illustrative embodiment, but various modifications may be made thereon. For example, in the illustrative embodiment, the second-stage selector 40 references the two least significant bits in the digital signal DI to select the final voltage. Alternatively, the second-stage selector 40 may use three or four least significant bits rather than two bits to select the target voltage.

In the illustrative embodiment, when the two least significant bits in the digital signal DI have a value of binary "0", the switch 32 isolates the second-stage resistive voltage divider from the output of the selector 20, thereby providing the node N4 with the lower limit voltage VL. Alternatively, there may be provided a second-stage resistive voltage divider that is always connected and a selector that selects the output of the divider.

In the illustrative embodiment, when the load signal LD is at its "H" level, the upper limit voltage VH is outputted to the node N4. Alternatively, the switches 32 and 33 may be differently arranged to output the lower limit voltage VL. In addition, the switch 60 on the output side may be omitted.

Figure 4:
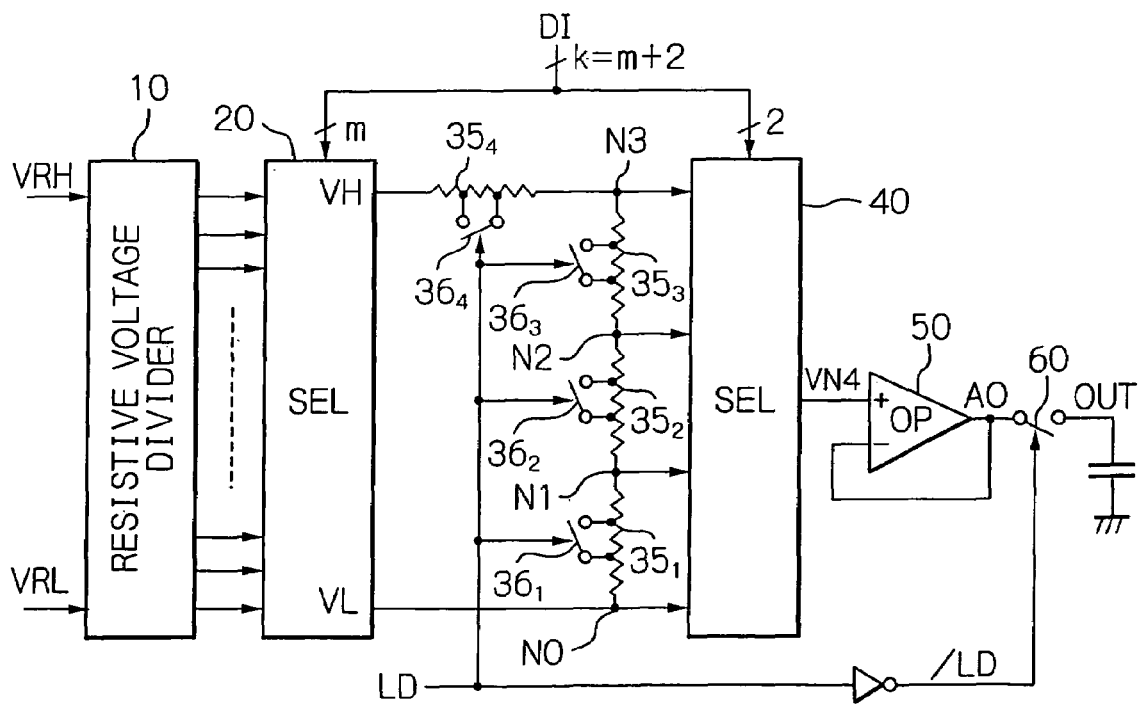
FIG. 4 is a schematic block diagram of the digital-to-analog converter of an alternative embodiment according to the present invention.

Well, FIG. 4 will be referred which schematically shows in a block diagram the digital-to-analog converter of an alternative embodiment according to the present invention. Like elements are designated with the same reference symbols or numerals.

The digital-to-analog converter depicted in FIG. 4 may be the same as the digital-to-analog converter shown in FIG. 1 except that the resistors $31_1$ to $31_4$ in the second-stage resistive voltage divider and the switches $33_1$ to $33_3$ that short-circuit the resistors $31_2$ to $31_4$ shown in FIG. 1 are replaced with a resistive voltage divider and a switch group that are slightly different in configuration. Specifically, the selector 20 is interconnected to output the voltage VL to a node N0. between the nodes N0 and N1, a resistor $35_1$ is connected, and between the nodes N1 and N2 a resistor $35_2$ is connected. Further, between the nodes N2 and N3 connected is a resistor $35_3$. The selector 20 is further interconnected to output the voltage VH via a resistor $35_4$ to the node N3. The resistors $35_1$ to $35_4$ have the same resistance R, equal to, e.g., 200 k[ohm], much greater than the resistance of the resistors included in the resistive voltage divider 10.

The resistors $35_1$ to $35_4$ each include taps therein. The switches $36_1$ to $36_4$ are interconnected to short-circuit the respective taps. The switches $36_1$ to $36_4$ are turned to the ON or conductive state thereof whenever the load signal LD is at its "H" level. When the switches $36_1$ to $36_4$ are in the ON state thereof, the resistors $35_1$ to $35_4$ have a reduced resistance, for example, about half as large as the normal resistance.

The nodes N0, N1, N2, and N3 connect to the selector 40 that selects the input according to the two least significant bits in the digital signal DI. The selector 40 selects the voltage VN4 and outputs it to the operational amplifier 50. Other configurations may be the same as those shown in and described with reference to FIG. 1.

When the digital signal DI changes periodically, the digital-to-analog converter shown in FIG. 4 in turn changes the load signal LD to its "H" level for a predetermined period of time. The switches $36_1$ to $36_4$ thus become the ON state thereof, and half the normal resistance value is provided for each of the resistors $35_1$ to $35_4$ in the second-stage resistive voltage divider that is connected in parallel with the output of the selector 20. The voltage VN4 provided to the operational amplifier 50, therefore, changes relatively quickly to its final voltage. At this point, however, a small resistance is provided for the second-stage resistive voltage divider that is connected in parallel with the first-stage resistive voltage divider 10, thus causing errors in the pair of voltages VL and VH outputted from the selector 20.

When the load signal LD returns to its "L" level, the switches $36_1$ to $36_4$ become the OFF state thereof, and the normal resistance is provided for each of the resistors $35_1$ to $35_4$ in the second-stage resistive voltage divider that is connected in parallel with the output of the selector 20. The pair of voltages VL and VH outputted from the selector 20 is thus adjusted to voltages with smaller errors. Accordingly, the voltage VN4 outputted from the selector 40 is adjusted to the correct value. The adjusted voltage that is significantly small may quickly complete the adjustment operation.

As described above, the digital-to-analog converter in the alternative embodiment includes the switches $36_1$ to $36_4$ that are adapted to reduce, when conductive, the resistance of each of the resistors $35_1$ to $35_4$ in the second-stage resistive voltage divider when the digital signal DI changes its logical state. The input of the operational amplifier 50 may thus quickly be rendered to its target voltage when the digital signal DI changes. The resistors $35_1$ to $35_4$ then return to the normal resistance thereof, quickly completing the adjustment operation. The alternative embodiment may thus have the same advantage as the illustrative embodiment shown in and described with reference to FIG. 1.

The alternative embodiment may be more advantageous than the illustrative embodiment shown in FIG. 1 when the pair of voltages VL and VH selected by the selector 20 has a larger voltage difference, for example, 0.5 V or more, therebetween, because the input of the operational amplifier 50 may become the target voltage when the load signal LD is at its "H" level. In the illustrative embodiment shown in FIG. 1, the input of the operational amplifier 50 becomes the voltage VH when the load signal LD is at its "H" level, and the input changes, after the load signal LD returns to its "L" level, to the target voltage specified by the two least significant bits.

The present invention is not limited to the above-described alternative embodiment, but various modifications may be made thereto. For example, as described earlier, the second-stage selector 40 may use three or four least significant bits in the digital signal DI to select the final target voltage.

The values of the voltage and resistance in the above-described embodiments are shown by way of example, and may be set to any values according to the circuit condition to which the invention is applied.

The entire disclosure of Japanese patent application No. 2005-198610 filed on Jul. 7, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A digital-to-analog converter for converting a digital signal including a plurality of bits into a corresponding analog voltage, comprising:
   a first divider for dividing a voltage between a lower reference voltage and an upper reference voltage into a plurality of stepwise voltages;
   a first selector for selecting, according to at least one most significant bit in the digital signal, a pair of lower limit voltage and upper limit voltage adjacent to each other among the plurality of stepwise voltages;
   a second divider having a resistor for dividing the voltage between the lower limit voltage and the upper limit voltage into a plurality of divided voltages;
   a second selector for selecting, according to at least one least significant bit in the digital signal, a voltage associated with the at least one least significant bit among the plurality of divided voltages as an output voltage; and
   a switch provided in parallel with the resistor in said second divider for short-circuiting opposite ends of the resistor for a predetermined period of time.

2. The converter in accordance with claim 1, wherein the predetermined period of time starts after the digital signal changes.

3. The converter in accordance with claim 1, wherein the switch is controlled with a load signal.

4. The converter in accordance with claim 1, wherein the stepwise voltage comprises a plurality of voltages which are different from each other, the plurality being equal to a value resultant from two raised to a number of the at least one most significant bit plus one.

5. The converter in accordance with claim 4, wherein the second divider comprises a number of resistors, the number being equal to two raised to a number of the at least one least significant bit.

6. A digital-to-analog converter for converting a digital signal including a plurality of bits into a corresponding analog voltage, comprising:
   a first divider for dividing a voltage between a lower reference voltage and an upper reference voltage into a plurality of stepwise voltages;
   a first selector for selecting, according to at least one most significant bit in the digital signal, a pair of lower limit voltage and upper limit voltage adjacent to each other among the plurality of stepwise voltages;
   a second divider having a resistor for dividing the voltage between the lower limit voltage and the upper limit voltage into a plurality of divided voltages;
   a second selector for selecting, according to at least one least significant bit in the digital signal, a voltage associated with the at least one least significant bit among the plurality of divided voltages as an output voltage; and
   a switch provided in parallel with the resistor in said second divider for reducing resistance of the resistor for a predetermined period of time.

7. The converter in accordance with claim 6, wherein the predetermined period of time starts after the digital signal changes.

8. The converter in accordance with claim 6, wherein the switch is controlled with a load signal.

9. The converter in accordance with claim 6, wherein the stepwise voltage comprises a plurality of voltages which are different from each other, the plurality being equal to a value resultant from two raised to a number of the at least one most significant bit plus one.

10. The converter in accordance with claim 9, wherein the second divider comprises a number of resistors, the number being equal to two raised to a number of the at least one least significant bit.

11. A digital-to-analog converter for converting a digital signal including a plurality of bits into a corresponding analog voltage, comprising:
   a first divider for dividing a voltage between a lower reference voltage and an upper reference voltage into a plurality of stepwise voltages;
   a first selector for selecting, according to at least one most significant bit in the digital signal, a pair of lower limit voltage and upper limit voltage adjacent to each other among the plurality of stepwise voltages;
   a second divider having a resistor for dividing the voltage between the lower limit voltage and the upper limit voltage into a plurality of divided voltages;
   a second selector for selecting, according to at least one least significant bit in the digital signal, a voltage associated with the at least one least significant bit among the plurality of divided voltages as an output voltage;

a switch provided in parallel with the resistor in said second divider for short-circuiting opposite ends of the resistor for a predetermined period of time; and a switch for changing two or more output nodes of said second divider to the plurality of divided voltages that are approximated for a predetermined period of time.

12. The converter in accordance with claim 11, wherein said switch is connected between the opposite ends of the resistor in said second divider.

13. The converter in accordance with claim 11, wherein said switch reduces resistance of the resistor in said second divider to generate the plurality of divided voltages.

* * * * *